(12) United States Patent
Zhang (10) Patent No.: US 6,518,826 B2
(45) Date of Patent: Feb. 11, 2003

(54) METHOD AND APPARATUS FOR DYNAMIC LEAKAGE CONTROL

(75) Inventor: Kevin X. Zhang, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/892,631

(22) Filed: Jun. 28, 2001

(65) Prior Publication Data

US 2003/0001663 A1 Jan. 2, 2003

(51) Int. Cl.[7] .................................................. H03K 3/01
(52) U.S. Cl. ....................................................... 327/534
(58) Field of Search ................................. 327/530, 534, 327/535, 537, 544, 545, 546

(56) References Cited

U.S. PATENT DOCUMENTS

| | | | | |
|---|---|---|---|---|
| 5,583,457 A | * | 12/1996 | Horiguchi et al. | 326/121 |
| 5,606,265 A | * | 2/1997 | Sakata et al. | 326/21 |
| 5,614,847 A | * | 3/1997 | Kawahara et al. | 326/121 |
| 5,781,062 A | * | 7/1998 | Mashiko et al. | 327/215 |
| 6,034,563 A | * | 3/2000 | Mashiko | 327/377 |
| 6,049,245 A | * | 4/2000 | Son et al. | 326/17 |
| 6,097,113 A | | 8/2000 | Teraoka et al. | 307/125 |
| 6,118,328 A | * | 9/2000 | Morikawa | 327/534 |
| 6,177,831 B1 | | 1/2001 | Yoneda et al. | 327/537 |
| 6,191,615 B1 | | 2/2001 | Koga | 326/81 |
| 6,232,793 B1 | | 5/2001 | Arimoto et al. | 326/34 |
| 6,304,110 B1 | | 10/2001 | Hirano | 327/108 |
| 6,329,874 B1 | * | 12/2001 | Ye et al. | 327/390 |
| 6,333,571 B1 | | 12/2001 | Teraoka et al. | 307/125 |
| 6,380,798 B1 | | 4/2002 | Mizuno et al. | 327/534 |

* cited by examiner

Primary Examiner—Jeffrey Zweizig
(74) Attorney, Agent, or Firm—Antonelli, Terry, Stout & Kraus, LLP

(57) ABSTRACT

A method and apparatus are provided for reducing leakage current in a chip. This may include determining whether a functional block is in an inactive state and reducing the leakage current of the functional block when the functional block is in the inactive state. This may involve using a sleeping transistor or applying reverse body bias to a substrate associated with the functional block.

35 Claims, 6 Drawing Sheets

METHOD AND APPARATUS FOR DYNAMIC LEAKAGE CONTROL

FIELD

The present invention is directed to leakage control. More particularly, the present invention is directed to leakage control for mobile processing units.

BACKGROUND

As technology scaling continues, transistors are producing more and more leakage current which effects power consumption. This is particularly important for mobile processing units (such as a portable computer) in which there is a limited amount of power available. Furthermore, leakage power takes a significant portion of a total power budget for a mobile processing unit.

Leakage current is especially a problem at higher temperatures. Leakage current may be managed based on standby leakage when a chip or processing unit is in an idle state and the temperature is not that high. However, leakage current in an active state may be much worse since the chip temperature may be very high causing the transistors to leak more. For example, a sub threshold leakage of a metal-oxide semiconductor field effect transistor (MOSFET) may be increased up to ten times when the temperature is raised from room temperature to 100° Celsius. It is therefore extremely desirable to control active leakage current in low-power mobile processing units.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto.

The following represents brief descriptions of the drawings in which like references numerals represent like elements and wherein.

DETAILED DESCRIPTION

In the following detailed description, like reference numerals and characters may be used to designate identical, corresponding or similar components in differing figure drawings. Further, in the detailed description to follow, example sizes/models/values/ranges may be given, although the present invention is not limited to the same. With regard to the description of any signals, the terms HIGH and LOW may be used in an intended generic sense. The state of these signals may be easily reversed by a change in logic. Additionally, well known power/ground connections to integrated circuits (ICs) and other components may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements may be highly dependent upon the platform within which the present invention is to be implemented. That is, such specifics should be well within the knowledge of one skilled in the art.

Embodiments of the present invention relate to a method and mechanism for reducing leakage current in a chip (such as a processing unit). The method may include determining whether a functional block is in either an inactive state (or inactive mode) or an active state (or active mode). The leakage current of the functional block may be reduced when the functional block is in the inactive state. The leakage current may be reduced by turning OFF a sleeping transistor that is associated with the functional block. Additionally, the leakage current may be reduced by applying a reverse body bias to a substrate associated with the functional block. In this manner, the leakage power may be dynamically controlled during operation.

Embodiments of the present invention are also applicable to dynamic leakage control. This may be accomplished by dividing a chip into segments and individually controlling each segment based on a mode or state (such as a sleep mode or an active mode).

Figure 1:
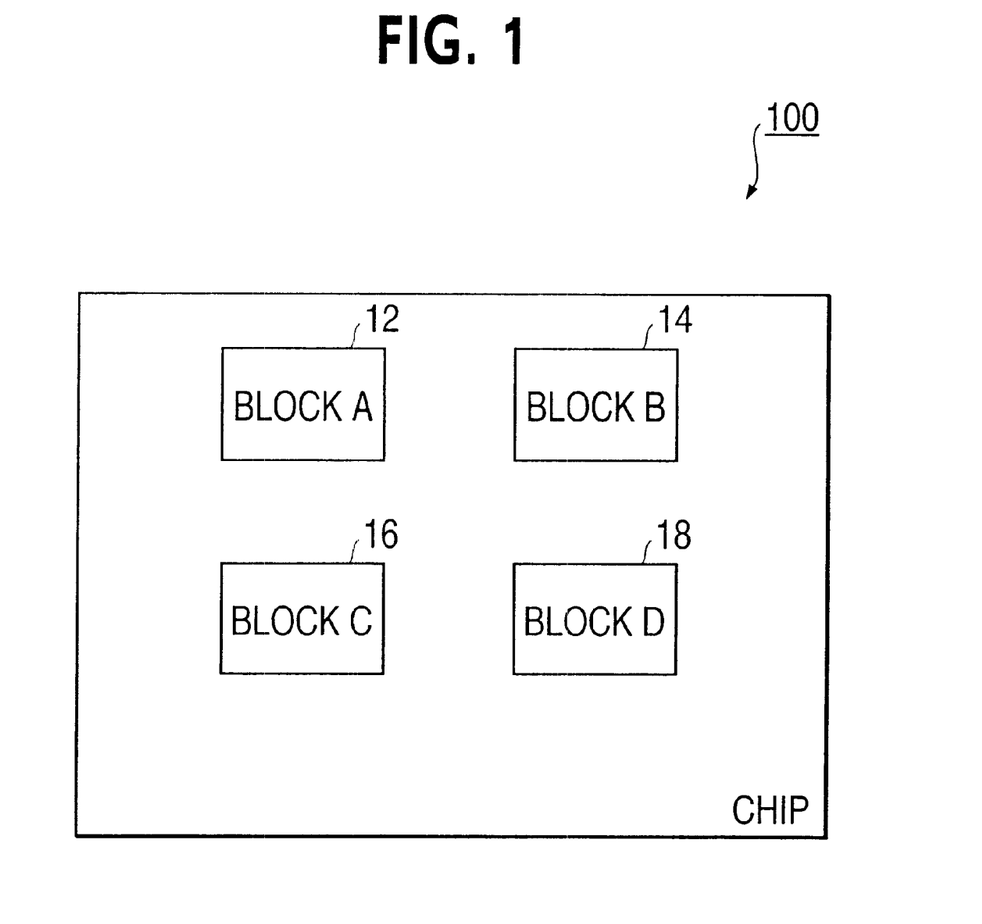
FIG. 1 illustrates a chip divided into functional blocks.

More specifically, FIG. 1 shows a chip 100 of a processing unit, for example. Other arrangements of the chip are also possible. In this example, the chip 100 may include a large number of electronic devices (or components) such as transistors. The electronic devices are not shown for ease of illustration. The chip 100 may include a plurality of blocks such as a block 12, a block 14, a block 16 and a block 18. The blocks 12, 14, 16 and 18 may be classified based on their functionality or other means to distinguish them. That is, each block may be considered a separate functional unit block (FUB). For example, the chip 100 may be partitioned into different functionalities such as a floating point unit block and an integer execution unit block. Although not shown, each of the blocks 12, 14, 16 and 18 may surround a plurality of electronic devices on the chip 100 capable of operating (i.e., functioning) on their own such that each block surrounds a self contained system. Embodiments of the present invention will be described with respect to different functional blocks although embodiments of the present invention are also applicable to the blocks being distinguished for other reasons.

Figure 2:
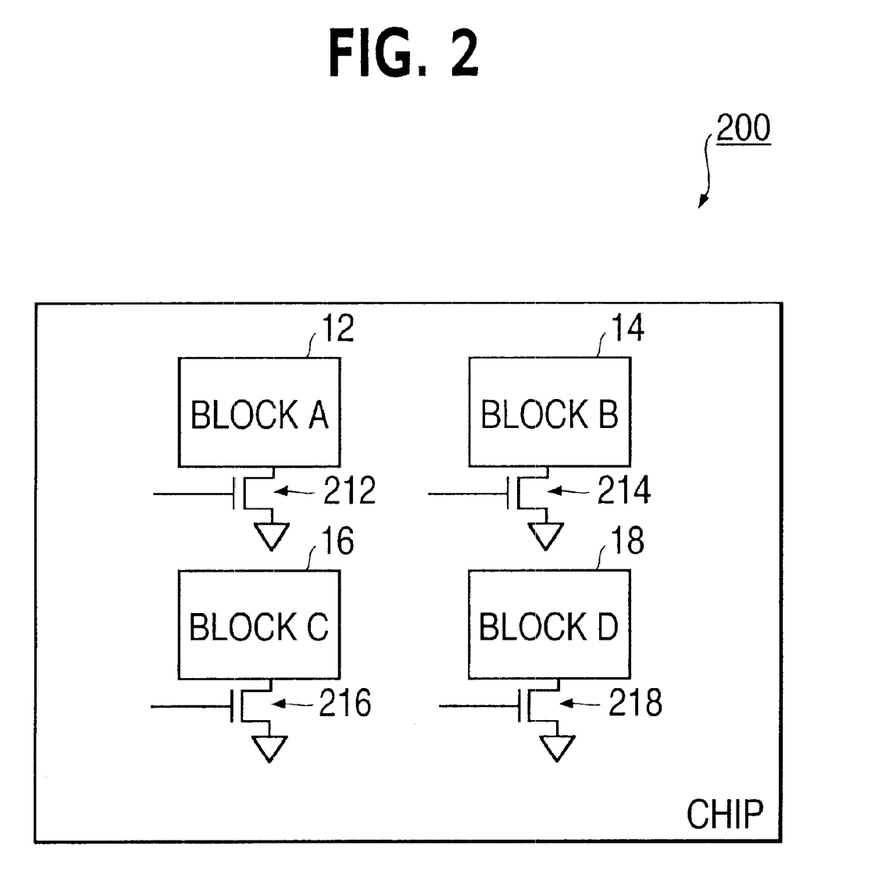
FIG. 2 illustrates sleeping transistors to control leakage current according to an example embodiment of the present invention.

FIG. 2 illustrates sleeping transistors that may be used to control leakage currents of the functional blocks 12, 14, 16 and 18 according to an example embodiment of the present invention. Other embodiments and configurations are also within the scope of the present invention. More specifically, FIG. 2 shows a sleeping transistor 212 coupled between the functional block 12 and ground, a sleeping transistor 214 coupled between the functional block 14 and ground, a sleeping transistor 216 coupled between the functional block 16 and ground and a sleeping transistor 218 coupled between the functional block 18 and ground. Each of the sleeping transistors 212, 214, 216 and 218 may operate (i.e., turn ON or OFF) based on a leakage control signal applied to a gate of each transistor. Each leakage control signal may control whether its respective sleeping transistor is turned ON or turned OFF. The turning ON or the turning OFF of each of the sleeping transistors 212, 214, 216 and 218 may be based on whether each of the respective functional blocks 12, 14, 16 and 18 is in an active state or in an inactive state. Embodiments of the present invention are also applicable to the determination of whether each of the functional blocks 12, 14, 16 and 18 will be in an active state or an inactive state.

When the functional block 12 is in an active state, then the sleeping transistor 212 may be ON (or turned ON) so that the functional block 12 may be coupled to ground. However, if the functional block 12 is in an inactive state, then the sleeping transistor 212 may be OFF (or turned OFF) such that the functional block 12 is not directly coupled to true ground (but rather may be at a virtual ground). Accordingly, the leakage current from the functional block 12 will not be able to travel to ground as easily as compared to when the sleeping transistor 212 is ON. This will thereby reduce the leakage current associated with the functional block 12. In operation, each of the functional blocks 12, 14, 16 and 18 will be separately controlled based on the leakage control signal applied to the sleeping transistors 212, 214, 216 and 218, respectively. Each of the functional blocks 12, 14, 16 and 18 may be (or will be) in a different state and therefore each of the functional blocks may be separately controlled. That is, the block 12 may be in an inactive state while the block 14 may be in an active state. Thus, the leakage control signal applied to the sleeping transistor 212 may be different from the leakage control signal applied to the sleeping transistor 214.

Figure 3:
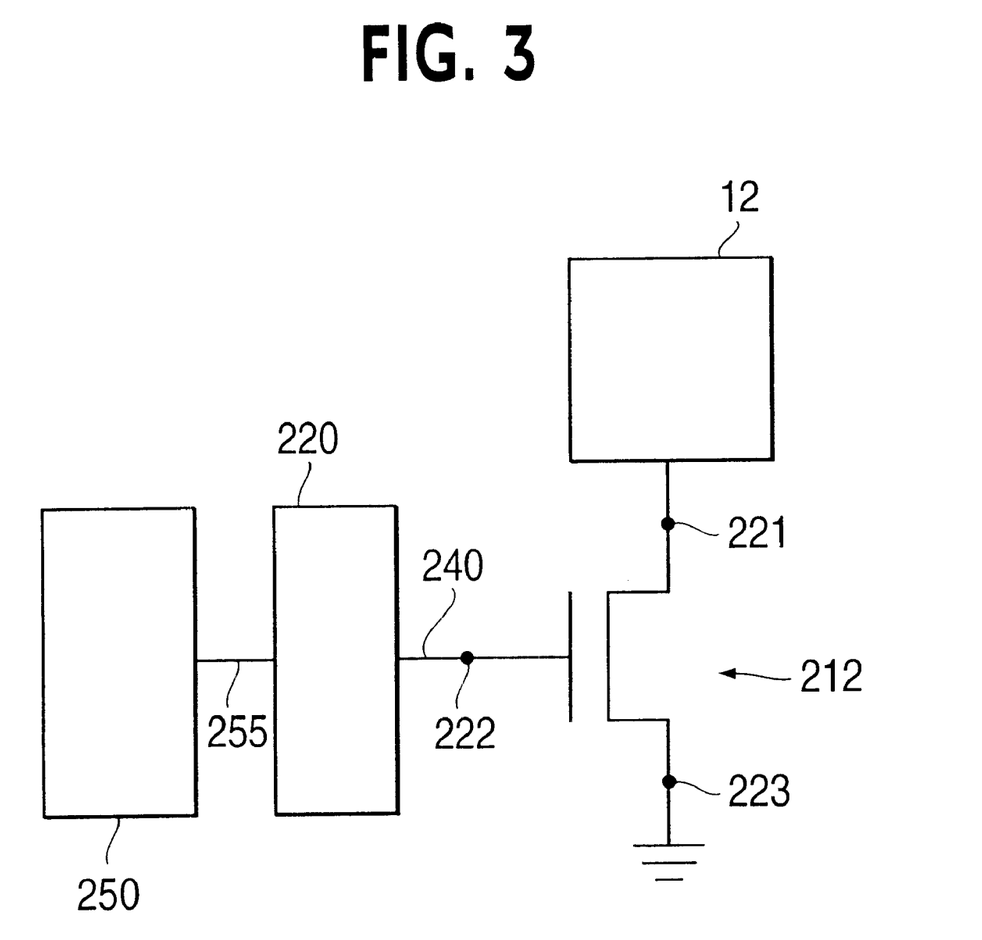
FIG. 3 illustrates a sleeping transistor coupled to a functional block according to an example embodiment of the present invention.

FIG. 3 illustrates the sleeping transistor 212 coupled to the functional block 12 according to an example embodiment of the present invention. Other embodiments and configurations are also within the scope of the present invention. In particular, other types of transistors or transistor-like devices are also applicable.

FIG. 3 shows that the sleeping transistor 212 has a drain 221 coupled to the functional block 12, a source 223 coupled to ground and a gate 222 coupled to a leakage control device 220 (or voltage controlling device) by a leakage control signal 240. In one embodiment of the present invention, each of the blocks 12, 14, 16 and 18 may be associated with a separate leakage control device and separate leakage control signal such as the leakage control device 220 and the leakage control signal 240. In another embodiment of the present invention, each of the blocks 12, 14, 16 and 18 may be coupled to the same leakage control device that may individually control or be associated with each of the functional blocks 12, 14, 16 and 18 by separate leakage control signals.

When the transistor 212 is in an ON state, then both leakage and active current may flow from the functional block 12 through the transistor 212 to the ground. This thereby couples the functional block 12 to ground. However, when the transistor 212 is in the OFF state, then the current may not flow as easily through the transistor 212 to the ground (since the transistor 212 is OFF). That is, the functional block 12 is not directly coupled to ground. The ON/OFF state of the sleeping transistor 212 is based on the leakage control signal 240 output from the leakage control device 220 to the gate 222 of the sleeping transistor 212. In operation, an operating system 250 (shown in FIG. 3) may determine (or know) whether each of the functional blocks 12, 14, 16 and 18 is in an active state or in an inactive state. The operating system 250 may provide an indication to each of the leakage control blocks to thereby control the signals that are output to the gates of each of the sleeping transistors 212, 214, 216 and 218. For example, in FIG. 3, the operating system 250 may provide an indication signal on a signal line 255 to the leakage control device 220. The leakage control device 220 may thereby output the leakage control signal 240 to the gate 222 of the transistor 212. A state of the leakage control signal 240 may control whether the transistor is turned ON or OFF.

As discussed above, a sleeping transistor may be coupled to each individual functional block. Each of the sleeping transistors may be controlled (i.e., turned ON/OFF) based on a leakage control (block enabling) signal. When a block is in an active state or will be in an active state, then the respective sleeping transistor may be turned ON to provide normal operation. However, when the block is in an inactive state or will be in an inactive state, then the respective sleeping transistor may be turned OFF to minimize leakage current from the block. The leakage reduction from an inactive functional block may be up to ten times the amount of leakage current.

Figure 4:
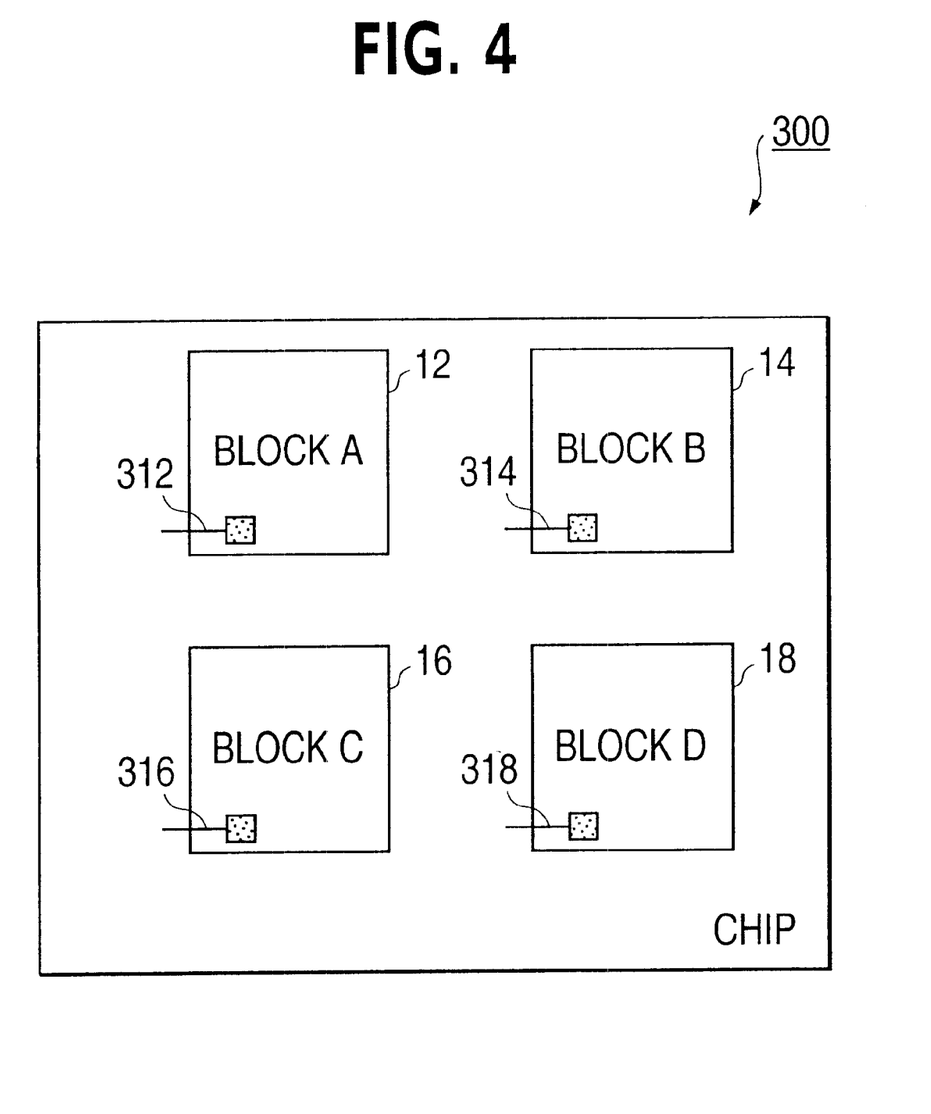
FIG. 4 illustrates body control applied to functional blocks according to an example embodiment of the present invention.

FIG. 4 illustrates how body control may be applied to each functional block according to an example embodiment of the present invention. Other embodiments for performing body control are also within the scope of the present invention. In this embodiment, a reverse body bias may be applied to a substrate of each functional block. The application of the reverse body bias may reduce the overall leakage current of the respective functional block. In one embodiment, each functional block may be separately isolated within a separate well so that each functional block may be separately controlled although this is not necessary.

In FIG. 4, the functional block 12 may be controlled by applying (or varying) a leakage control signal on a signal line 312 coupled to a substrate associated with the functional block 12. The functional block 14 may be controlled by applying (or varying) a leakage control signal to a signal line 314 coupled to a substrate associated with the functional block 14. The functional block 16 may be controlled by applying (or varying) a leakage control signal to a signal line 316 coupled to a substrate associated with the functional block 16. The functional block 18 may be controlled by applying (or varying) a leakage control signal to a signal line 318 coupled to a substrate associated with the functional block 18. The leakage control signals applied on the signal lines 312, 314, 316 and 318 may be output from a single leakage control device (or a single voltage controlling device) or from a plurality of leakage control devices (or a plurality of voltage controlling devices). In this manner, each of the functional blocks 12, 14, 16 and 18 may be individually controlled. As in the above embodiment, an operating system may provide an indication to each of the leakage control devices to thereby control the leakage control signals applied to the substrate of the respective functional blocks 12, 14, 16 and 18.

Figure 5:
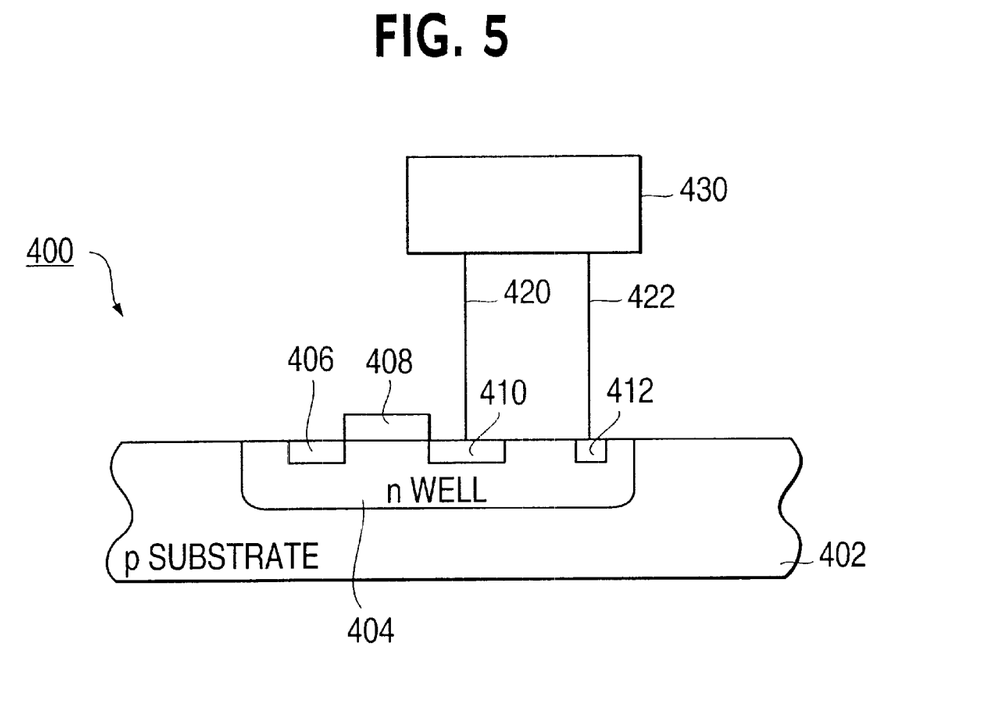
FIG. 5 illustrates how body control may be applied to a PMOS integrated circuit according to an example embodiment of the present invention.

FIG. 5 illustrates an example p-channel metal-oxide semiconductor (PMOS) transistor in which body control may be applied according to an example embodiment of the present invention. Other embodiments and configurations are also within the scope of the present invention. In particular, the PMOS transistor 400 includes a p substrate 402 and an n well 404. The n well 404 includes a drain region 406 of p+ dopant, a gate region 408, a source region 410 of p+ dopant and a body (or substrate) contact 412 of n+ dopant. This configuration of PMOS transistors is well known to one skilled in the art.

The source region 410 may be coupled by a signal line 420 to a voltage controlling device 430 and the body contact 412 may be coupled by a separate signal line 422 to the voltage controlling device 430. As such, a first signal may be applied along the signal line 420 to the source region 410 and a second signal may be applied along the signal line 422 to the body contact 412. Voltage levels of the signals on the signal lines 420 and 422 may be controlled based on the voltage controlling device 430, which may be further coupled to an operating system. As in the above described embodiment, the operating system may provide an indication to each of the leakage control devices to thereby control the signals on the signal lines 420 and 422. The voltage controlling device 430 may be coupled to other portions of the PMOS transistor 400 although those other connections are not shown in FIG. 5 for ease of illustration.

In accordance with embodiments of the present invention, a reverse body bias may be applied to the body contact 412 so as to alter the body bias of the transistor 400. In a PMOS transistor under normal body bias, the n well 404 may be biased to VCC. This may be accomplished by applying a VCC bias to the body contact 412 and a VCC bias to the source region 410, for example. VCC may correspond to 1.8 volts although other values of VCC are also possible. However, for reverse body bias, the n well 404 may be biased to a voltage higher than VCC. Accordingly, when the operating system determines that the functional block 12 is (or will be) in an inactive state, then the operating system sends an indication to the voltage controlling device 430. The voltage controlling device 430 may thereby adjust the voltage level of the signal on the signal line 422 such that a reverse body bias is applied to the transistor 400. In one embodiment, the voltage controlling device 430 may apply a signal of a voltage level VCC on the signal line 420 to the source region 410 and a signal having a bias of more than VCC on the signal line 422 to the body contact 412. In one embodiment, the bias may be 500 millivolts more than VCC although other values of the bias are also within the scope of the present invention. Other means for applying reverse body bias to a PMOS transistor are also possible.

Figure 6:
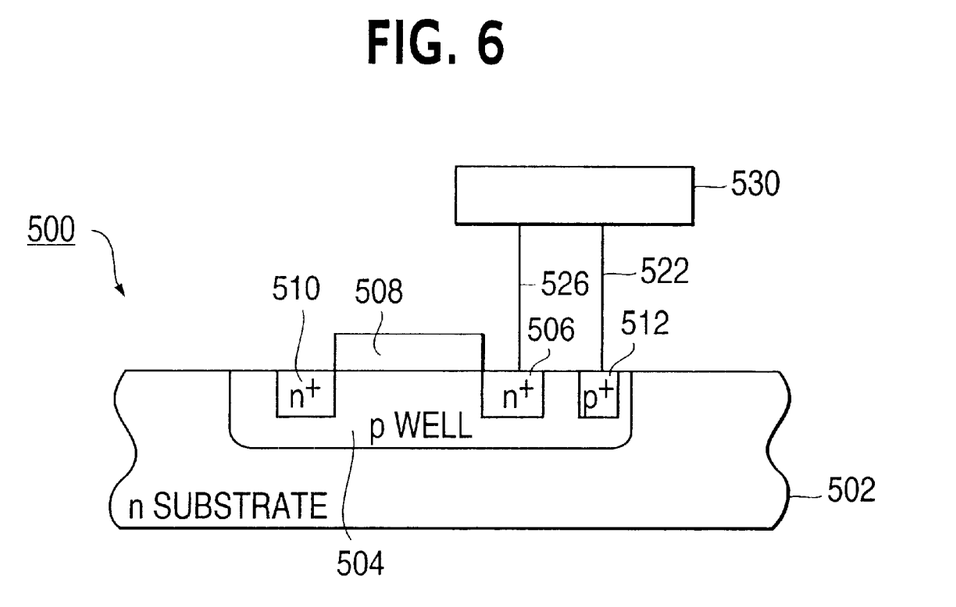
FIG. 6 illustrates how body control may be applied to an NMOS integrated circuit according to an example embodiment of the present invention.

Embodiments of the present invention are also applicable to an n-channel metal-oxide semiconductor (NMOS) transistor. FIG. 6 illustrates an example NMOS transistor in which body control may be applied according to an example embodiment of the present invention. Other embodiments and configurations are also within the scope of the present invention. In particular, the NMOS transistor 500 includes an n substrate 502 and a p well 504. The p well 504 includes a drain region 510 of n+ dopant, a gate region 508, a source region 506 of n+ dopant and a body (or substrate) contact 512 of n+ dopant. This configuration of NMOS transistors is well known to one skilled in the art.

The source region 506 may be coupled by a signal line 526 to a voltage controlling device 530 and the body contact 512 may be coupled by a separate signal line 522 to the voltage controlling device 530. As such, a first signal may be applied along the signal line 526 to the source region 506 and a second signal may be applied along the signal line 522 to the body contact 512. Voltage levels of the signals on the signal lines 526 and 522 may be controlled based on the voltage controlling device 530, which may be further coupled to an operating system. As in the above described embodiment, the operating system may provide an indication to each of the leakage control devices to thereby control the signals on the signal lines 526 and 522. The voltage controlling device 530 may be coupled to other portions of the NMOS transistor 500 although those other connections are not shown in FIG. 6 for ease of illustration.

In accordance with embodiments of the present invention, a reverse body bias may be applied to the body contact 512 so as to alter the body bias of the transistor 500. In an NMOS transistor under normal body bias, the p well 504 may be biased to ground. This may be accomplished by applying a ground bias to the body contact 512 and a ground bias to the source region 506. However, for reverse body bias, the p well 504 may be biased to a voltage lower than ground. In order to apply a reverse body bias to the substrate, a slightly negative bias (i.e., more negative than ground) may be applied to the substrate using the body contact 512. Accordingly, when the operating system determines that the functional block 12 is (or will be) in an inactive state, then the operating system may send an indication to the voltage controlling device 530. The voltage controlling device 530 may thereby adjust the voltage levels on the signal line 522 such that a reverse body bias is applied to the transistor 500. In one embodiment, the voltage controlling device 530 may apply a signal of a ground voltage on the signal line 520 to the source region 506 and a signal having a bias of less than ground to the body contact 512. In one embodiment, the bias may be 500 millivolts less than ground although other values of the bias are also within the scope of the present invention. Other means for applying a reverse body bias to an NMOS transistor are also possible.

In the FIG. 5 embodiment, a signal may be applied (or varied) along the signal line 422 (corresponding to the signal line 312 in FIG. 4) to the body contact 412 (FIG. 5) so as to provide a reverse body bias or a normal body bias for a PMOS type of transistor. In the FIG. 6 embodiment, a signal may be applied (or varied) along the signal line 522 (corresponding to the signal line 312 in FIG. 4) to the body contact 512 so as to provide a reverse body bias or a normal body bias for an NMOS type of transistor.

Each of the functional blocks 12, 14, 16 and 18 may be provided within their own separate well so that the substrate of each of the functional blocks 12, 14,16 and 18 may be separately controlled. This may be accomplished using a twin well process as is well known in the art. Other techniques for isolating the respective functional blocks may also be utilized.

Accordingly, embodiments of the present invention may provide a method for reducing leakage current from functional blocks of a chip. This may involve determining whether a first functional block is in (or will be in) an inactive state and reducing the leakage current of the first functional block when the first functional block is determined to be in the inactive state. Reducing the leakage current may be accomplished by turning OFF a sleeping transistor associated with the first functional block or by applying a reverse body bias to a substrate associated with the first functional block. Still further, the method may also include determining whether a second functional block is in (or will be in) an inactive state and separately reducing the leakage current of the second functional block when the second functional block is determined to be in the inactive state.

Embodiments of the present invention may also provide an apparatus that includes a chip (having a first functional block and a second functional block), a first device (such as an operating system) and a second device (such as a leakage controlling device). The first device may determine whether the first functional block is in one of an inactive state and an active state. The second device may receive an indication from the first device indicative of whether the first functional block is in either the inactive state or the active state. The second device may further reduce the leakage current of the first functional block when the first functional block is determined to be in the inactive state.

Any reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, certain method procedures may have been delineated as separate procedures; however, these separately delineated procedures should not be construed as necessarily order dependent in their performance. That is, some procedures may be able to be performed in an alternative ordering, simultaneously, etc.

Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed:

1. A method of reducing leakage current comprising:
    determining whether a first functional block on a chip is in an inactive state; and
    reducing said leakage current of said first functional block when said first functional block is determined to be in said inactive state.

2. The method of claim 1, wherein reducing said leakage current comprises turning OFF a sleeping transistor associated with said first functional block.

3. The method of claim 2, wherein turning OFF said sleeping transistor comprises applying a signal to a gate of said sleeping transistor.

4. The method of claim 2, further comprising determining whether said first functional block is in an active state, and turning ON said sleeping transistor when said first functional block is determined to be in said active state.

5. The method of claim 4, wherein turning ON said sleeping transistor comprises applying a signal to a gate of said sleeping transistor.

6. The method of claim 1, wherein reducing said leakage current comprises applying a reverse body bias to a substrate associated with said first functional block.

7. The method of claim 6, further comprising determining whether said first functional block is in an active state, and removing said reverse body bias when said first functional block is determined to be in said active state.

8. The method of claim 1, wherein said first functional block is provided within said chip that also includes a second functional block, said method further comprising:
    determining whether said second functional block is in an inactive state; and
    reducing said leakage current of said second functional block when said second functional block is determined to be in said inactive state.

9. The method of claim 8, wherein said leakage current of said second functional block is reduced without regard to a state of said first functional block.

10. A method comprising:
    determining whether a first functional block of a chip is in one of a first state and a second state; and
    controlling a feature of said first functional block based on said determination.

11. The method of claim 10, wherein said feature comprises leakage current from said first functional block.

12. The method of claim 11, wherein said controlling comprises reducing leakage current associated with said first functional block by turning OFF a sleeping transistor associated with said first functional block when said first functional block is determined to be in said first state.

13. The method of claim 11, wherein turning OFF said sleeping transistor comprises applying a signal to a gate of said sleeping transistor.

14. The method of claim 11, wherein said controlling comprises turning ON said sleeping transistor when said first functional block is determined to be in said second state.

15. The method of claim 14, wherein turning ON said sleeping transistor comprises applying a signal to a gate of said sleeping transistor.

16. The method of claim 11, wherein said controlling comprises reducing leakage current associated with said first functional block by applying a reverse body bias to a substrate associated with said first functional block when said first functional block is determined to be in said first state.

17. The method of claim 16, further comprising removing said reverse body bias when said first functional block is determined to be in said second state.

18. The method of claim 10, wherein said first functional block is provided within said chip that also includes a second functional block, said method further comprising:
    determining whether said second functional block is in one of said first state and said second state; and
    controlling a feature of said second functional block based on said determination.

19. The method of claim 18, wherein said feature of said second functional block is controlled without regard to a state of said first functional block.

20. A method for reducing leakage current comprising:
    determining whether a first block will be in an inactive state; and
    reducing said leakage current of said first block when said first block will be in said inactive state.

21. The method of claim 20, wherein reducing said leakage current comprises turning OFF a transistor associated with said first block.

22. The method and apparatus of claim 20, wherein reducing said leakage current comprises applying a reverse body bias to a substrate associated with said first block.

23. The method of claim 20, further comprising:
    determining whether a second block will be in an inactive state; and
    reducing said leakage current of said second block when said second block will be in said inactive state.

24. The method of claim 23, wherein said leakage current of said second block is reduced without regard to a state of said first block.

25. A method of reducing leakage current on a chip comprising:

determining a state of a first block of said chip; and applying a reverse body bias to a substrate associated with said first block when said first block is determined to be in an inactive state.

26. The method of claim 25, further comprising removing said reverse body bias when said first block is determined to be in an active state.

27. The method of claim 25, further comprising:

determining a state of a second block of said chip; and applying a reverse body bias to a substrate associated with said second block when said second block is determined to be in an inactive state.

28. An apparatus comprising:

a chip having at least a first functional block and a second functional block;

a first device to determine whether said first functional block is in one of an inactive state and an active state; and a second device to couple to said first functional block and to said first device so as to receive a signal from said first device indicative of whether said first functional block is in said one of said inactive state and said active state, said second device to reduce leakage current of said first functional block when said first functional block is determined to be in said inactive state.

29. The apparatus of claim 28, wherein said second device comprises a sleeping transistor associated with said first functional block.

30. The apparatus of claim 29, wherein to reduce said leakage current, said second device applies a signal to a gate of said sleeping transistor to turn OFF said sleeping transistor.

31. The apparatus of claim 30, wherein said second device applies a signal to said gate of said sleeping transistor to turn ON said sleeping transistor when said first device determines said first functional block is in said active state.

32. The apparatus of claim 28, wherein said second device comprises a voltage controlling device and a signal line to couple to a substrate associated with said first functional block, said second device to apply a reverse body bias to said substrate when said first device determines that said first functional block is in said inactive state.

33. The apparatus of claim 28, further comprising a third device to determine whether said second functional block is in an inactive state, and a fourth device to couple to said second functional block and to said third device so as to receive a signal indicative of whether said second functional block is in said inactive state, said fourth device to reduce leakage current of said second functional block when said second functional block is determined to be in said inactive state.

34. The apparatus of claim 28, wherein said first device comprises an operating system.

35. The apparatus of claim 33, wherein said fourth device to reduce leakage current of said second functional block without regard to a state of said first functional block.

* * * * *